(12) United States Patent
Rupp et al.

(10) Patent No.: US 9,793,167 B2
(45) Date of Patent: Oct. 17, 2017

(54) METHOD FOR FORMING A WAFER STRUCTURE, A METHOD FOR FORMING A SEMICONDUCTOR DEVICE AND A WAFER STRUCTURE

(71) Applicant: Infineon Technologies AG, Neubiberg (DE)

(72) Inventors: Roland Rupp, Lauf (DE); Wolfgang Lehnert, Lintach (DE); Francisco Javier Santos Rodriguez, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/224,076

(22) Filed: Jul. 29, 2016

(65) Prior Publication Data

US 2017/0033010 A1 Feb. 2, 2017

(30) Foreign Application Priority Data

Jul. 31, 2015 (DE) .................. 10 2015 112 648

(51) Int. Cl.
*H01L 21/30* (2006.01)
*H01L 21/78* (2006.01)
*H01L 29/16* (2006.01)
*H01L 21/02* (2006.01)

(52) U.S. Cl.
CPC .... *H01L 21/7813* (2013.01); *H01L 21/02002* (2013.01); *H01L 21/78* (2013.01); *H01L 29/1608* (2013.01)

(58) Field of Classification Search
USPC ........................................................ 438/458
See application file for complete search history.

(56) References Cited

U.S. PATENT DOCUMENTS

| 2012/0080690 A1 | 4/2012 | Berger et al. |
| 2014/0225125 A1 | 8/2014 | Berger et al. |
| 2015/0171045 A1 | 6/2015 | Berger et al. |

FOREIGN PATENT DOCUMENTS

| JP | H10-223496 | 8/1998 |
| JP | 2003/282845 | 7/2003 |
| JP | 2012/142385 | 6/2012 |
| JP | 2013/124196 | 6/2013 |
| JP | 2014/154885 | 7/2014 |
| WO | WO 2004/001819 | 12/2003 |

OTHER PUBLICATIONS

Office Action communication of the German Patent and Trademark Office for Appln. Ser. No. 102015112648.6, Mar. 10, 2016.
Office Action Communication of the Japanese Patent and Trademark Office re Application 2016-149957, May 17, 2017.
Office Action Communication of the German Patent and Trademark Office re Application 10 2015 112 648.6, Mar. 10, 2016.

*Primary Examiner* — Timor Karimy
(74) *Attorney, Agent, or Firm* — Baker Botts L.L.P.

(57) ABSTRACT

A method of producing a semiconductor device and a wafer structure are provided. The method includes attaching a donor wafer comprising silicon carbide to a carrier wafer comprising graphite, splitting the donor wafer along an internal delamination layer so that a split layer comprising silicon carbide and attached to the carrier wafer is formed, removing the carrier wafer above an inner portion of the split layer while leaving a residual portion of the carrier wafer attached to the split layer to form a partially supported wafer, and further processing the partially supported wafer.

15 Claims, 5 Drawing Sheets

METHOD FOR FORMING A WAFER STRUCTURE, A METHOD FOR FORMING A SEMICONDUCTOR DEVICE AND A WAFER STRUCTURE

CROSS-REFERENCE TO RELATED APPLICATION

This application claims priority to German Application Serial No. 102015112648.6 filed Jul. 31, 2015 and entitled "A Method for Forming a Wafer Structure, a Method for Forming a Semiconductor Device and a Wafer Structure".

TECHNICAL FIELD

Embodiments of the present invention relate to a wafer structure, in particular to a wafer structure including a silicon carbide wafer and a support structure, a method for forming the wafer structure and a method for forming a semiconductor device.

BACKGROUND

In order to improve the device characteristics of semiconductor devices attempts have been made to reduce the final thickness of semiconductor material. In particular for power semiconductor devices, it is often desired that the semiconductor body of such devices has a thickness which is just sufficient for accommodating the device or circuit.

The manufacturing and handling of thin semiconductor chips and wafers is often complicated since the brittle semiconductor material such as silicon carbide (SiC), once thinned, is prone to breaking. Further, monocrystalline SiC is comparatively expensive. To improve the mechanical stability of thin semiconductor material, carrier systems have been developed. One approach uses a polycrystalline SiC (poly-SiC) carrier wafer attached to a monocrystalline SiC layer. This structure may be formed by direct bonding a monocrystalline SiC substrate to the carrier wafer and subsequent peeling the monocrystalline SiC substrate from the carrier wafer while leaving part of the single-crystal substrate on the carrier wafer. Although being cheaper than monocrystalline SiC, poly-SiC carrier wafers are still comparatively expensive. Further, the formed interface between poly-SiC and monocrystalline SiC requires special care. This increases processing costs.

For these and other reasons there is a need for the present invention.

SUMMARY

According to an embodiment of a method of forming a semiconductor device, the method includes attaching a donor wafer comprising silicon carbide to a carrier wafer comprising graphite, splitting the donor wafer along an internal delamination layer so that a split layer which comprises silicon carbide is attached to the carrier wafer, forming a partially supported wafer, and further processing the partially supported wafer. Forming the partially supported wafer includes removing the carrier wafer above an inner portion of the split layer while leaving a residual portion of the carrier wafer attached to the split layer.

According to an embodiment of a method for forming a wafer structure, the method includes providing a silicon carbide wafer having a first side, implanting high energy particles form the first side into the silicon carbide wafer, bonding the first side of the silicon carbide wafer to a carrier wafer comprising graphite, and splitting a first layer from the silicon carbide wafer. The method further includes removing the carrier wafer above an inner portion of the first layer to form at the first layer a support structure only partly covering the first layer, or removing the carrier wafer after depositing a silicon carbide layer on the split layer and forming a support structure at the silicon carbide layer so that the support structure only partly covers the silicon carbide layer.

According to an embodiment of a wafer structure, the wafer structure includes a silicon carbide wafer and a support structure comprising at least one of silicon, silicon carbide, graphite and glass. The support structure is glued on a peripheral area of the silicon carbide wafer surrounding a device area of the silicon carbide wafer when seen from above, and only partly covers the silicon carbide wafer.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1A:
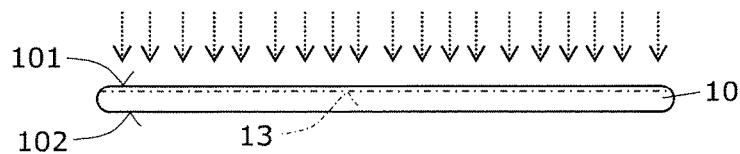
FIGS. 1A to 1G illustrate method steps of a method for forming a wafer structure and a semiconductor device, respectively, according to embodiments.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal side of a semiconductor substrate or body. This can be for instance the surface of a wafer or a die.

The term "vertical" as used in this specification intends to describe an orientation which is substantially arranged perpendicular to the first side, i.e. parallel to the normal direction of the first side of the semiconductor substrate or body.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n−" means a doping concentration which is less than the doping concentration of an "n"-doping region while an "n+"-doping region has a larger doping concentration than the "n"-doping region. However, indicating the relative doping concentration does not mean that doping regions of the same relative doping concentration have to have the same absolute doping concentration unless otherwise stated. For example, two different n+-doping regions can have different absolute doping concentrations. The same applies, for example, to an n+ doping and an n+-doping and a p+-doping region.

Specific embodiments described in this specification pertain to, without being limited thereto, manufacturing SiC semiconductor devices on wafer level and SiC-wafers.

The SiC semiconductor devices to be manufactured may be power semiconductor devices.

The term "power semiconductor device" as used in this specification intends to describe a semiconductor device on a single chip with high voltage and/or high current switching capabilities. In other words, power semiconductor devices are intended for high current, typically in the ampere range. Within this specification the terms "power semiconductor device" and "power semiconductor component" are used synonymously.

The term "field-effect" as used in this specification intends to describe the electric-field mediated formation of a conductive "channel" and/or control of conductivity and/or shape of the channel in a semiconductor region using an insulated gate electrode or a Schottky-gate electrode.

FIG. 1A to FIG. 1G illustrate processes of a method for forming a wafer structure 100 and SiC-semiconductor devices on wafer-level, respectively.

A SiC donor wafer 10 is provided. The SiC donor wafer 10 may be of the 4H—SiC polytype having a C-side (also known as C-face) 101 and Si-side (also known as Si-face) 102. Further, the SiC donor wafer 10 may be cut from a SiC ingot.

In the exemplary embodiment illustrated in FIG. 1A showing a vertical cross-section through the donor wafer 10, particles, typically protons are implanted into the donor wafer 10 from the C-side 101 into a given depth. The particle implantation is represented by dotted arrows in FIG. 1A. The implantation depth can be adjusted by selecting the implantation energy.

The implantation of atoms or ions (typically gas ions such as protons), respectively, may cause the formation of a delamination layer 13 which can be a micro-bubble layer or micro-porous layer along the donor wafer 10.

The implantation depth defines the position of the delamination layer 13 and thus the thickness of a split layer 1 transferred to a carrier wafer 20. For example, 80 keV protons with a dose between $5*10^{16}$ cm$^{-2}$ and $8*10^{16}$ cm$^{-2}$ are mainly implanted to a depth of about 0.5-2 μm in SiC. Typically, the proton implantation energy is in range from about 50 keV to about 200 keV.

Figure 1B:
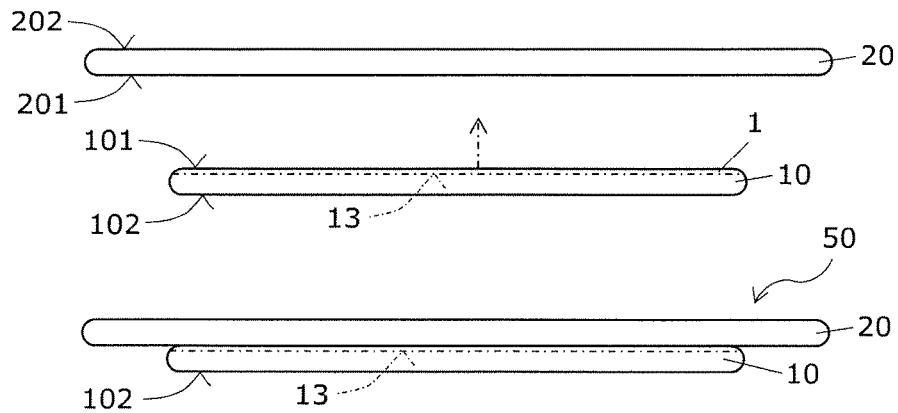

The carrier wafer 20 has a lower side 201 and an upper side 202 opposite the lower side 201 and includes or is formed by a graphite wafer. As illustrated in FIG. 1B, the carrier wafer 20 has typically a larger size (extension in horizontal directions parallel the lower side 201 and/or the upper side 202) than the donor wafer 10. However, the carrier wafer 20 and the donor wafer 10 may also have the same extensions in horizontal directions.

Graphite is one of the three known allotropes of carbon. Within this specification the terms "graphite wafer" and "carbon wafer" are used synonymously.

To protect the graphite wafer against oxidation and to prevent the release of carbon particles, the carrier wafer 20 is typically a composite wafer formed by a graphite wafer (i.e. a wafer consisting of graphite or consisting essentially of graphite) that is surrounded by thin protecting layer, typically a thin SiC-layer. The SiC-layer of the carrier wafer 20 may have a thickness in a range from about 10 to about 2000 nm, more typically in a range from about 50 to about 500 nm. For sake of clarity, the protecting layer is not shown in the cross-sections of FIG. 1A and FIG. 1B. The vertical extension of the carrier wafer 20 is typically in a range from about 10 μm to about 2500 μm, more typically in a range from about 50 μm to about 1500 μm To form a wafer stack 50, the donor wafer 10 is typically attached with its implanted side, which is the C-side 101 in the exemplary embodiment, to the carrier wafer 20.

Attaching of the donor wafer 10 to the carrier wafer 20 is typically done by bonding. Accordingly, the donor wafer 10 and the carrier wafer 20 are joined through a bonding layer (also not shown in FIG. 1B) of the wafer stack 50.

The bond connection between the donor wafer 10 and the carrier wafer 20 is typically implemented such that it can withstand temperatures of at least about 1300° C. or of at least about 1450° C., e.g. temperatures of up to about 1600° C. used for a later so-called smart-cut layer transfer and subsequent epitaxial growth.

The bonding may be accomplished by adhesive bonding. For this, a ceramic-forming polymer precursor may be used as adhesion layer. For example, the bonding may be carried out with a SiC ceramic-forming polymer precursor.

Alternatively, a spin-on-glass (SoG) may be used as adhesion layer. The use of SoG facilitates an initial low temperature bond, and can withstand the thermal stresses at high temperature (800-900° C.) where layer splitting may occur. A SoG-adhesion layer may only be used when the delamination layers 13 is sufficiently deep to allow later device manufacturing.

By the use of an adhesive ceramic-forming precursor (e.g. an adhesive SiC precursor) as the adhesive material, thermal mismatch between the active layer and the bonding zone and the undesired forming of reaction zones between bond layer and the active layer at high temperature processes may be avoided.

The ceramic-forming polymer precursor may comprise or consist (e.g. only) of carbon, silicon, and hydrogen. When the hydrogen diffuses during the bonding process, only polycristalline silicon carbide may remain. For example, the ceramic-forming polymer precursor may be an allyl-hydrido-polycarbosilan or another polycarbosilane.

In an embodiment one or both sides of the bonding sides or surfaces 101, 201 are coated with the ceramic-forming polymer precursor, followed by tempering between 200 to 700° C. For example, the tempering may be performed at a temperature of about 530° C. for about 4 hour.

As a first part of the bonding procedure, the ceramic-forming polymer precursor may be applied either to the carrier wafer 20 or the donor wafer 10. Alternatively, the ceramic-forming polymer precursor can be applied on the surfaces 101, 201 of both, the carrier wafer 20 and the donor wafer 10. The ceramic-forming polymer precursor can be applied e.g. by spin-on or spray processes.

As indicated by the dashed-dotted arrow in FIG. 1B, the carrier wafer 20 may thereafter be joined with the donor wafer 10 facing the sides 101, 201, where the polymer precursor was applied, to form a compound structure or wafer-stack 50. The so joined wafers 10, 20 may be subjected to a heat treatment (tempering) to form a stable and durable bond between the carrier wafer and the donor wafer 10.

After the joining, the wafer stack 50 may be heated to form the bond. For example, temperatures ranges can be from about room temperature to about 600° C., or from 200-700° C.

Tempering the wafer stack 50 may be done in a first temperature range and subsequently in a second temperature range which is different than the first temperature range. The second temperature range can encompass temperatures higher than the first temperature range. The second temperature range can be, for example, from about 500° C. to about 1000° C. or even higher.

When using allyl-hydrido-polycarbosilane as precursor, it may be pyrolyzed to polycrystalline silicon carbide at high temperatures of e.g. 1500° C.-1700° C. (e.g. for the complete conversion of the precursor layer into polycrystalline SiC). Thus, the bonding layer between the SiC and the carrier wafer may become SiC itself during the bonding process, thus omitting effects which might arise when using other types of material and furthermore assuring electrical connectivity. For example, the bonding layer may be n-doped SiC.

Furthermore, a mechanically and thermally extremely stable bond connection may be formed by converting the bonding layer into SiC.

A strengthening of the bond connection and a separation (see below) of the SiC donor wafer 10 may occur at 700° C.-1800° C.

Thus, three tempering processes performed at different temperatures may be used. However, the tempering processes may also be combined into a single process having a given temperature profile. Further, the tempering may at least temporarily takes place under (compacting) pressure.

In an embodiment, the tempering takes place in an atmosphere including nitrogen and or a noble gas, e.g. a nitrogen atmosphere, an argon atmosphere, an atmosphere of nitrogen and argon, or an atmosphere of nitrogen and hydrogen. As nitrogen is a low donor in SiC, this may cause doping of the bond layer (e.g. polycrystalline SiC, which arises from the polymer) and an adjoining n monocrystalline SiC layer of the split layer during tempering, so that the vertical conductivity may be increased.

Figure 1C:
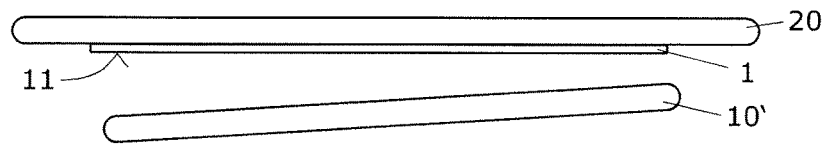

As illustrated in FIG. 1C, the donor wafer 10 is split along the internal delamination layer 13. This may be achieved by tempering at high temperature of at least 800° C. where splitting occurs. This may be a further tempering step, e.g. a de-bond annealing at about 1450° C. for about three hours, or done in parallel with hardening the bond connection as explained above with regard to FIG. 1B.

As a result a SiC split layer 1 (also referred to as smart-cut SiC-layer and first SiC-layer in the following) of the donor wafer 10 remains at the carrier wafer 20. In this way the split layer 1 is transferred from the donor wafer 10 to the carrier wafer 20 (smart-cut layer transfer). The graphite of the carrier wafer 20 can be one of turbostratic graphite, pyrolytic graphite, isostatically pressed graphite, and mixtures thereof. Graphite has a thermal expansion coefficient similar to that of SiC. This makes graphite a most promising carrier material for SiC. Furthermore, the thermal expansion coefficient of graphite can be fine-tuned by its porosity.

Thereafter, the split layer 1 may be polished, for example by using a CMP-process (chemical mechanical polishing).

The split part 10' of the donor wafer 10 may be reused (e.g. more than 5 times or more than 10 times) as a donor, as it can be brought back to a suitable initial state for smart-cut layer transfer by polishing and/or epitaxy. This may be very cost-efficient.

Alternatively to the mentioned procedure, also other methods (e.g. oxygen implantation) may be suitable to separate and transfer the semiconductor layer.

Figure 1D:
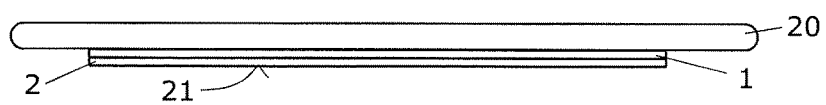

As illustrated in FIG. 1D, an epitaxial SiC-layer (in the following also referred to as further silicon carbide layer) 2 may subsequently be formed on the split layer 1 and at the Si-side 11 of the split layer 1, respectively. Epitaxial layer 2 and split layer 1 may form together a device wafer 1, 2.

Prior to epitaxial growth, the split layer 1 may have a thickness of 5 µm, 2 µm, 1 µm, or even only 0.5 µm.

In other embodiments (not illustrated in the figures), the split layer 1 has a thickness substantially corresponding to the thickness of the semiconductor body of the device to be manufactured.

As the epitaxy is performed at the Si-side 11 of the split layer 1, a high quality crystalline pattern of the epitaxial SiC-layer 2, even a more homogeneous crystalline pattern than that of the split layer 1, may be achieved. Furthermore, doping may be better controlled during epitaxy at the Si-side 11 compared to the C-side. Further, less (thickness) of the donor wafer 10 may be required. Accordingly, the process of transferring thin SiC-layers 1 of the donor wafer 10 can be repeated more often.

Further, several epitaxial SiC-layers 2 of different doping type, different doping concentration and/or different thickness may be formed on the split layer 1. For example, a highly n-doped first epitaxial SiC-layer may be formed at the split layer 1 and a low n-doped second epitaxial SiC-layer may be formed at the first epitaxial SiC-layer. The thickness of the first epitaxial SiC-layer may be chosen in accordance with mechanical stability requirements. The thickness and doping concentration of the second epitaxial SiC-layer may be chosen in accordance with device type and voltage class. For example, the second epitaxial SiC-layer may have a thickness of about 4.5 µm and a doping concentration of about $2*10^{16}/cm^3$ to form a drift region in a SiC-MOSFET of the 650V class to be manufactured.

The doping of the epitaxial SiC-layer(s) 2 may be adjusted during epitaxial growth but may also include dopant implantation(s) and a subsequent annealing.

Figure 1E:
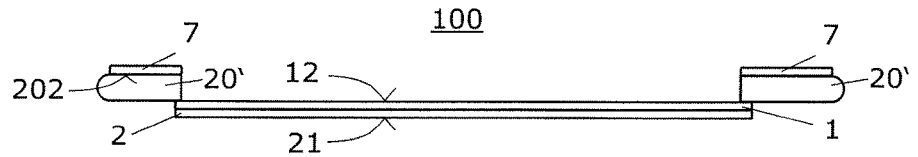

Thereafter, the carrier wafer 20 may be removed above an inner portion of the split layer 1 while leaving a residual portion 20' of the carrier wafer 20 attached to the split layer 1. As illustrated in FIG. 1E, this may be achieved by masked etching.

For example, a mask 7, e.g. a silicon nitride mask or a silicon oxide mask, having an opening in a device area may be formed on the carrier wafer 20 opposite to the SiC device wafer 1, 2, typically at the upper side 202. The area of the opening of the mask 7 is typically larger than about 50%, more typically larger than about 80% or even 90% than an area of the split layer 1. Further, the opening of the mask 7 may be contiguous and/or substantially centered with respect to the split layer 1. The opening of the mask 7 may be circular when seen from above (and the mask 7 contiguous), but may also have thin portions separating the mask 7 into several parts, e.g. ring-segments.

Thereafter, an ion beam etching and/or a chemical etching and/or a plasma etching may be used to expose SiC, for example the C-side 12 of the split layer 1. Thereafter, the mask 7 may be removed.

For example, ion beam etching may be used to remove a SiC protecting layer of the carrier wafer 20. Plasma etching (in particular plasma ashing) may be used to remove the graphite above the split layer 1. Further, an inner portion of the bond-layer may be removed using chemical etching to partly expose the split layer 1.

In embodiments in which the bond-layer is made of highly conductive (n-doped, typically nitrogen-doped or phosphorus-doped) SiC, the inner portion of the bond-layer is typically not removed. Further, the mask 7 may be removed even prior to plasma etching. This is because the remaining portions of the SiC protecting layer at a peripheral area of the carrier wafer 20 may also be used as mask for plasma etching.

Alternatively, or in addition removing the carrier wafer 20 above the inner portion of the split layer 1 may include one or more processes of milling and/or grinding the carrier wafer 20. For example, a cutter may be used to remove an inner portion of the carrier wafer 20 except for a thin remainder that is removed by plasma ashing stopping at the SiC on and/or at the split layer 1.

Thereafter, any openings of the SiC protecting layer on the on the residual 20' of the carrier wafer 20 (where graphite may be exposed) may be closed by depositing silicon and a thermal process.

Figure 1F:
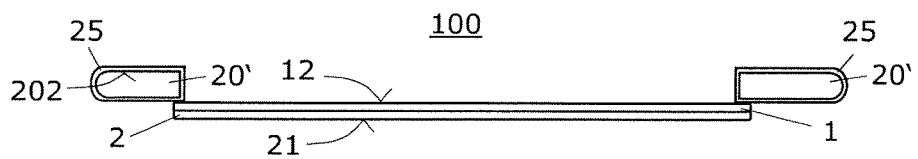
Figure 1G:
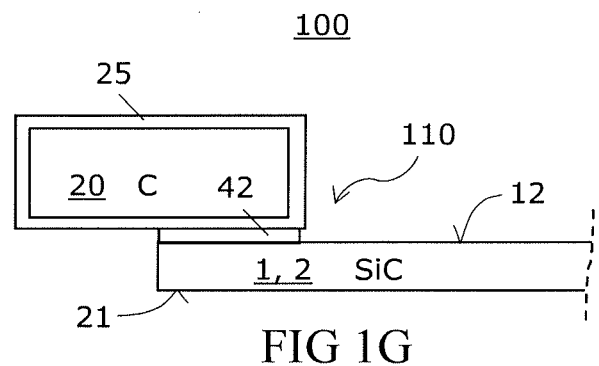

FIG. 1F illustrated the resulting partially supported wafer 100 including the SiC protecting layer 25 in a vertical cross-section after removing any deposited silicon from the split layer 1 which may be accomplished by etching. FIG. 1G is an enlarged view of FIG. 1F showing a left portion 110 of the partially supported wafer 100 including a remainder of the bonding layer 42.

As explained above, the bonding layer 42 may also be SiC. In this embodiment, the bonding layer 42 may even completely cover the split layer 1. Otherwise, the bonding layer 42 is typically removed from the split layer 1.

Accordingly, a partially supported wafer 100 is formed that can safely further processed from both sides 12, 21 of its SiC device wafer 1, 2. In the embodiments explained with regard to FIG. 1A to FIG. 1G, the C-side 12 typically forms a backside of the SiC device wafer 1, 2 and the typically polished side 21 of the monocrystalline silicon carbide layer(s) 2 typically forms a front-side of the SiC device wafer 1, 2.

In the exemplary embodiment, the residual 20' and exposed portions of the SiC protecting layer 25 form a support structure 20', 25 of the supported SiC wafer 1, 2. The support structure 20', 25 is glued to a peripheral area of the SiC wafer 1, 2. Typically, the support structure 20', 25 is glue-bonded (attached by an adhesive bonding, e.g. using an adhesive ceramic-forming precursor such as an adhesive SiC precursor) to the SiC wafer 1, 2.

Typically, the residual 20' of the partially supported wafer 100 is ring-shaped when seen from above. In these embodiments, the partially supported wafer 100 may be formed by a SiC membrane supported by a ring-shaped carrier (also referred to as ring-shaped carbon carrier and ring-shaped graphite carrier).

Further processing may include device processing such as processing the split layer 1, in particular forming a backside metallization on the split layer 1, forming a pn-junction in or at the silicon carbide layer(s) 2, forming a trench in the silicon carbide layer(s) 2, forming a gate electrode in the trench, forming a gate electrode on the silicon carbide layer(s) 2, forming a front-side metallization on the silicon carbide layer(s) 2, and/or separating the partially supported wafer 100 into individual semiconductor devices. These processes are to be understood as non-limiting examples for typical processes performed for device manufacturing on wafer-level.

Further, the mentioned processes for device processing may be done in different ways and/or may include several steps. For example, forming the backside metallization may include depositing, electroplating, applying a metal sinter paste, annealing and/or polishing.

To reduce thermal loads for already manufactured structures at the front-side 21, laser-annealing may be used for forming the backside metallization.

In embodiments referring to manufacturing of SiC-MOSFETs, the backside metallization typically forms a drain metallization.

In embodiments referring to manufacturing of SiC-Diodes, the backside metallization typically forms a cathode metallization.

Prior to device processing, the partially supported wafer 100 may be stored and even shipped after suitable packaging.

In another embodiment, the carrier wafer 20 is removed above the inner portion of the split layer 1 after finishing device processing at the front side 21.

Whether the front side 21 or the backside is first finished may depend on the temperature budgets of the processes.

Figure 2A:
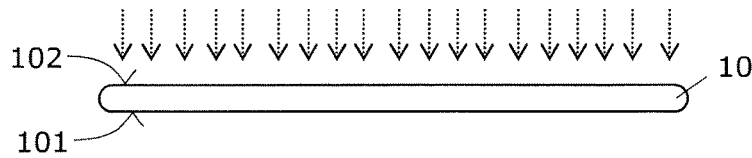
FIGS. 2A to 2F illustrate method steps of a method for forming a wafer structure and a semiconductor device, respectively, according to embodiments.
Figure 2B:
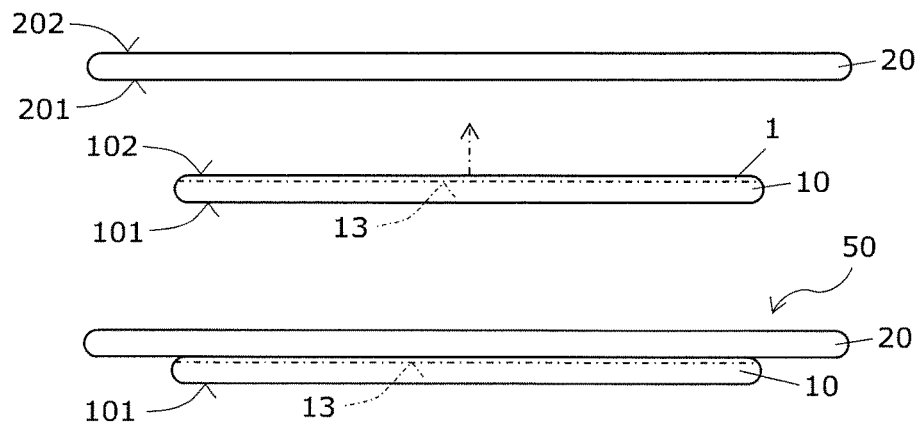
Figure 2C:
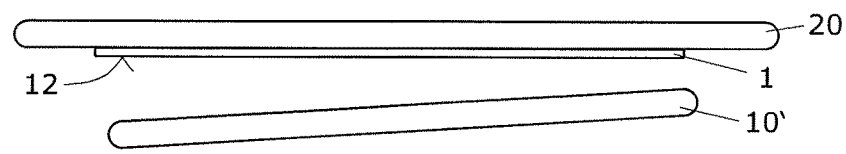

With regard to FIG. 2A to FIG. 2F processes of a method for forming a wafer structure 100' and SiC-semiconductor devices on waver-level, respectively, are explained that are similar to the method processes explained above with regard to FIG. 1A to FIG. 1G. However, the high energy particles are implanted from the Si-side 102 into the SiC donor wafer 10 as illustrated in FIG. 2A showing a vertical cross-section through the donor wafer 10. Further, the SiC donor wafer 10 is glue-bonded with its Si-side 102 to the carrier wafer 20 as illustrated in FIG. 2B. Accordingly, the C-side 12 of the transferred split layer 1 is accessible and Si-side 11 of the transferred split layer 1 is covered by the carrier wafer 20 after the smart-cut layer transfer illustrated in FIG. 2C. This process sequence may result in a particular high conductivity of a MOS-channel region(s) later formed at the C-side 11.

Figure 2D:
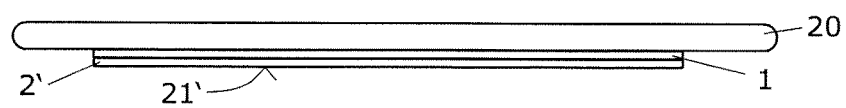

Thereafter, epitaxial SiC-layer(s) 2' may be formed on the split layer 1 similar as explained above with regard to FIG. 1D. A vertical cross-section through the resulting wafer structure is shown in FIG. 2D.

In the exemplary embodiment, the accessible side 21' of the silicon carbide layer(s) 2' typically forms a back-side of the SiC device wafer 1, 2. Accordingly, the silicon carbide layer(s) 2' may cost-efficiently be formed as polycrystalline-SiC (poly-SiC). The silicon carbide layer(s) 2' is typically highly doped to ensure a low vertical resistivity of the structure. Further, the poly-SiC layer(s) 2' may be used mainly for stability reasons.

After epitaxially depositing the SiC-layer(s) 2', dopants may be implanted into the the polycrystalline or monocrystalline SiC-layer(s) 2'. Further, a post implant anneal at e.g. 1700° C. may be carried out.

Thereafter, a partially supported wafer 100' is formed by completely removing the carrier wafer 20 above an inner portion of the split layer 1.

Figure 2E:
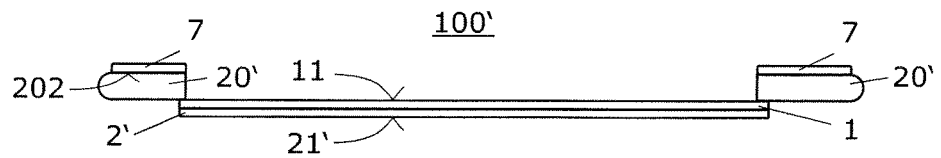
Figure 2F:
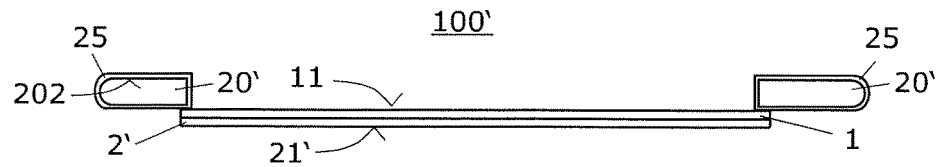

The processes for forming the partially supported wafer 100' illustrated in FIG. 2E and FIG. 2F are typically similar to the processes explained above with regard to FIGS. 1E and 1F. However, the bond layer is completely removed from the exposed Si-side 11 in FIG. 2E. This is because the Si-side 11 is later used as front-side of the SiC-wafer 1, 2'.

Thereafter, the partially supported wafer 100' may be further processed. This may include device processing such as forming a backside metallization on the epitaxial SiC-layer(s) 2', further processing the split layer 1 and separating the partially supported wafer 100 into individual semiconductor devices. Further processing the split layer 1 may include, forming a pn-junction in or at the split layer 1, forming a trench in the split layer 1, forming a gate electrode in the trench, forming a gate electrode on the split layer 1, and/or forming a front-side metallization on the split layer 1. Again, these processes are to be understood as non-limiting examples for typical processes performed for device manufacturing on wafer-level.

The methods explained above with regard to FIG. 1A to 2F may also be described as:
transferring a silicon carbide layer 1 from a donor wafer 10 to a carrier wafer 20 comprising graphite, and partly removing the carrier wafer 20 to form a support structure 20', 25 at the silicon carbide layer 1 so that the support structure 20', 25 only partly covers the silicon carbide layer 1.

In so doing, a wafer structure, in particular a partially supported wafer 100, 100' may be formed having a comparatively thin silicon carbide layer 1 (and optional epitaxial layers 2, 2') with a thickness of less than 100 μm, less than 75 μm or even less than 50 μm that can, due to the support structure 20', 25, be safely further processed from both sides. This allows flexible and cost efficient manufacturing of SiC-devices on wafer-level.

Typically, the silicon carbide layer 1 is transferred as a split layer 1. This may include attaching a donor wafer 10 comprising silicon carbide to the carrier wafer 20 and splitting the donor wafer 10 along an internal delamination layer 13.

Figure 3A:
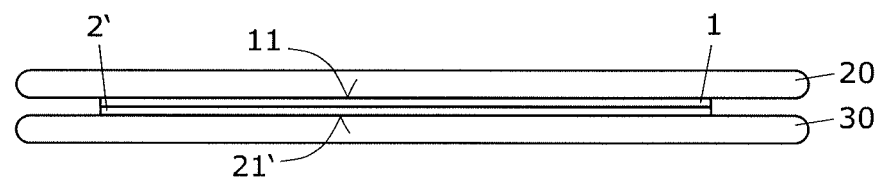
FIGS. 3A to 3D illustrate method steps of a method for forming a wafer structure and a semiconductor device, respectively, according to embodiments.

FIG. 3A to FIG. 3D illustrate further processes for forming a wafer structure 200 and semiconductor devices on wafer-level, respectively. After forming a structure as shown in FIG. 2D, a temporary carrier wafer 30, e.g. a cheap (poly-) Si-wafer or glass-wafer, is glue-bonded to the silicon carbide layer(s) 2'. FIG. 3A illustrates a vertical cross-section through the resulting wafer-structure.

Figure 3B:
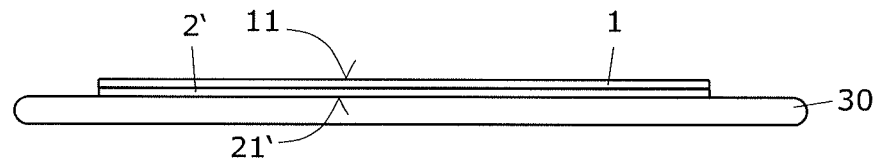

Thereafter, the carrier wafer 20 may be completely removed, e.g. by grinding, ashing (plasma etching in an oxygen atmosphere), followed by a planarization also completely removing the bond layer at the Si-side 11 of the split layer 1 later forming a front side of the wafer structure. FIG. 3B illustrates a vertical cross-section through the resulting wafer-structure.

Figure 3C:
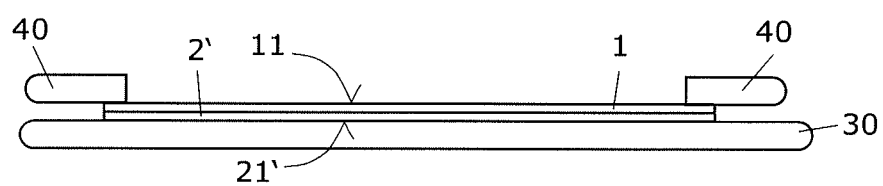

Thereafter, a support structure 40, for example a substantially ring-shaped glass-structure, may be formed at the split layer 1. The support structure 40 may be directly glued or glue-bonded to the split layer 1 at a peripheral portion of the Si-side 11. Alternatively, a support wafer may be attached to the split layer 1 and subsequently an inner portion of the support wafer may be removed while leaving a residual portion 40 of the support wafer 40 attached to the Si-side 11. FIG. 3C illustrates a vertical cross-section through the resulting wafer-structure.

In one embodiment, adhesive bonding using a glass adhesive is used for attaching the support structure 40. For example, silicate adhesives can be used which are commercially available, for example, from Dow Corning. Depending on the nature of the glass adhesive, the adhesive bond connection can withstand temperatures of up to 250° C. to 300° C. or even up to 450° C. for a short time in an inert atmosphere. This is sufficient for many of the manufacturing processes to which the semiconductor wafer is subjected for finishing the semiconductor components.

Depending on material of the support structure 40, any suitable bonding process can be employed for attaching to the split layer. Examples are anodic bonding with or without a diamond-like-carbon layer (DLC) on the split layer 1, glass-frit bonding, fusion bonding, and adhesive bonding using a glass adhesive.

Figure 3D:
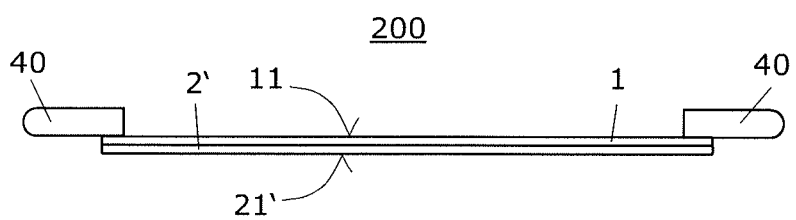

Thereafter, the temporary carrier wafer 30 may be removed again. The resulting partially supported wafer 200 is illustrated in FIG. 3D.

Thereafter, the partially supported wafer 200 may be further processed similar as explained above with regard to FIG. 2F.

Figure 4A:
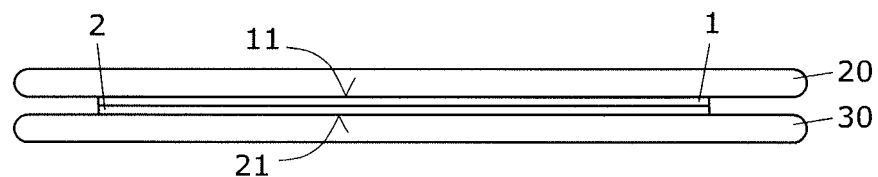
FIGS. 4A to 4E illustrate method steps of a method for forming a wafer structure and a semiconductor device, respectively, according to embodiments.

FIG. 4A to FIG. 4E illustrate further processes for forming a wafer structure 200' and semiconductor devices on wafer-level, respectively. After forming a structure as shown in FIG. 1D, a temporary carrier wafer 30, e.g. a cheap poly-Si-wafer or glass-wafer, is glue-bonded to the silicon carbide layer(s) 2. FIG. 4A illustrates a vertical cross-section through the resulting wafer-structure.

Figure 4B:
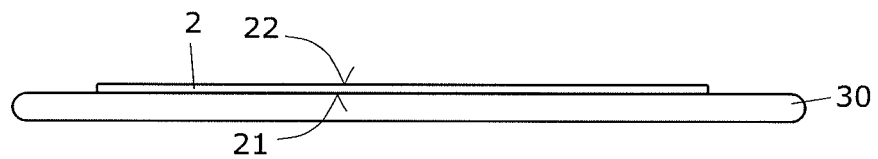

Thereafter, the carrier wafer 20 may be completely removed, e.g. by grinding, ashing (plasma etching in an oxygen atmosphere) and a planarization also completely removing the split layer 1. FIG. 4B illustrates a vertical cross-section through the resulting wafer-structure.

Figure 4C:
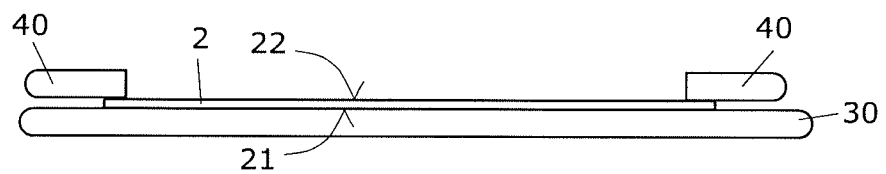

Thereafter, a support structure 40, for example a substantially ring-shaped glass-structure, may be formed at an exposed side 22 of the silicon carbide layer(s) 2. This may be done similar as explained above with regard to FIG. 3C. FIG. 4C illustrates a vertical cross-section through the resulting wafer-structure.

Figure 4D:
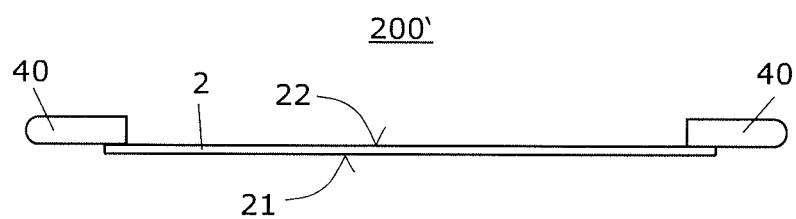
Figure 4E:
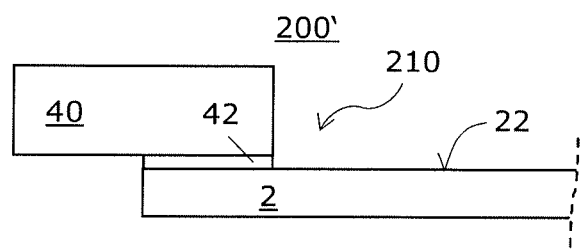

Thereafter, the temporary carrier wafer 30 may be removed again. The resulting partially supported wafer 200' is illustrated in FIG. 4D. FIG. 4E is an enlarged view of FIG. 4D showing a left portion 210 of the partially supported wafer 200' including a remainder of the bonding layer 42.

Thereafter, the partially supported wafer 200' may be further processed to manufacture several devices using the partially supported wafer 200'.

The method explained above with regard to FIG. 1A to 4E may also be described as a method for forming a wafer structure, in particular a partially supported wafer, with the steps of:

transferring a silicon carbide layer 1 from a donor wafer 10 to a graphite comprising wafer 20; and either removing the graphite comprising wafer 20 above an inner portion of the silicon carbide layer 1 to form at the silicon carbide layer 1 a support structure 20', 25 only partly covering the silicon carbide layer 1; or removing the graphite comprising wafer 20 after forming a support structure 40 opposite the graphite comprising wafer 20 only partly covering the silicon carbide layer 1 and/or a further silicon carbide layer 2, 2' deposited on the silicon carbide layer 1.

Accordingly, a wafer structure, which has a SiC-wafer that is supported by the support structure 40, 20', 25 in a peripheral area of the SiC-wafer, may be formed. Depending on process sequence and/or further optional steps, the SiC-wafer may be formed by the silicon carbide layer 1 and/or the further silicon carbide layer 2, 2'.

Due to the support structure 40, 20', 25, the SiC-wafer may be mechanically stable enough for further processing (such as device processing in a chip area surrounded by the peripheral area) even if the SiC-wafer is comparatively thin, for example less than 100 µm, less than 75 µm or even less than 50 µm thick. Note that forming the supported membrane-like SiC-wafer reduces the amount of expensive monocrystalline SiC. Further, the SiC-wafer is accessible from both sides for further processing. Even further, thermal problems during manufacturing due to the mismatch in thermal properties of SiC and graphite may be reduced by at least partly removing the graphite comprising wafer. This allows flexible and cost efficient manufacturing of SiC-devices (SiC-chips) on wafer-level, in particular power SiC-devices, e.g. power SiC-transistors, with blocking voltages up to 6.5 kV. However, the SiC-wafer may also have a larger thickness, for example a thickness of at least 120 µm or even higher for manufacturing of SiC-devices with even higher blocking voltages.

Figure 5A:
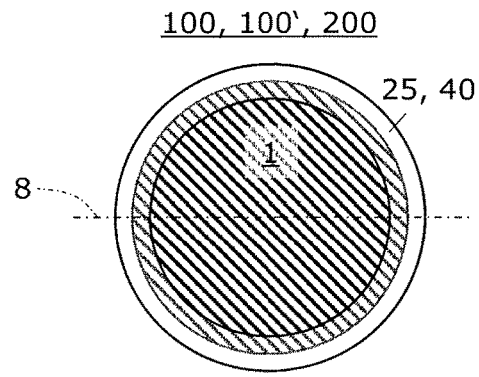
FIG. 5A illustrates a top view on a wafer structure according to an embodiment.

FIG. 5A illustrates a top view on the partially supported wafers 100, 100', 200 of FIG. 1F, FIG. 2F and FIG. 3D, respectively, which may correspond to sections along line 8 in FIG. 5A.

In the exemplary embodiment, the partially supported wafers 100, 100', 200 are formed by respective silicon carbide wafer 1 which are support by a respective contiguous ring-shaped support structure 20', 25, 40 either comprising poly silicon or glass (40) or comprising silicon carbide (25) and graphite (hidden in FIG. 5A by the protecting SiC layer 25, this also applies for epitaxial layers that may be formed at the split layer 1 of the silicon carbide wafer). The support structure 25, 40 is glued on a peripheral area of the silicon carbide wafer 1 surrounding an accessible device area of the silicon carbide wafer 1 not covered by the support structure 25, 40.

Typically, at most 50%, more typically at most 80% or even 90% of the silicon carbide wafer 1 are covered by the support structure 25, 40.

For example, the support structure 40, 25 may only cover a ring-shaped peripheral area with a width of at least about 1 mm and typically to about 10 mm, while a horizontal extension of the silicon carbide wafer 1 (wafer size) may be up to 100 mm, 200 mm or even 300 mm.

A vertical extension (thickness) of the silicon carbide wafer 1 may be is less than 100 µm, less than 80 µm or 60 µm or even less than 50 µm.

In other embodiment, a support structure as shown in FIG. 5A is glue-bonded to an epitaxial layer (2, not shown in FIG. 5A).

Figure 5B:
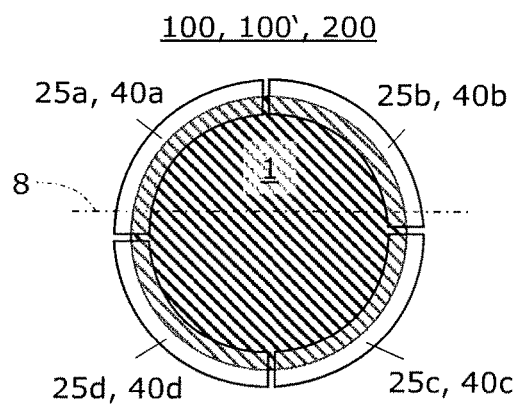
FIG. 5B illustrates a top view on a wafer structure according to another embodiment.

FIG. 5B illustrates a top view on the partially supported wafers 100, 100', 200 of FIG. 1F, FIG. 2F and FIG. 3D, respectively, which may correspond to sections along line 8 in FIG. 5B.

The support structure is similar as explained above with regard to FIG. 5A, but consists of exemplary four ring-segment shaped portions 25a, 40a, 25b, 40b, 25c, 40c, 25d, 40d which are pairwise spaced apart from each other by respective pathways. Despite the pathways, the partially supported wafers may be sufficiently stable for later device processing. The pathways may facilitate later spin-on processes used during device manufacturing (improved drain of excess material).

In other embodiment, a support structure as shown in FIG. 5B is glue-bonded to an epitaxial layer (2, not shown in FIG. 5B).

Figure 5C:
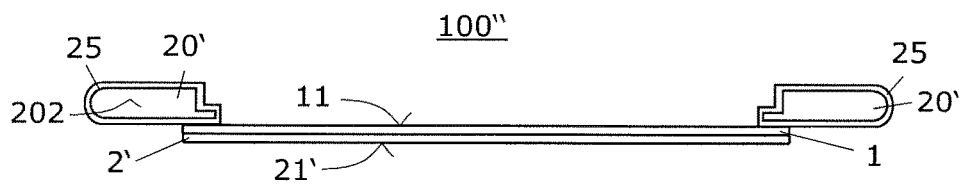
FIG. 5C illustrates a vertical cross-section through a wafer structure according to an embodiment.

FIG. 5C illustrates a vertical cross-section through a partially supported wafer 100''. The partially supported wafer 100'' is similar to the partially supported wafer 100' explained above with regard to FIGS. 1F, 5A, 5B. However, the partially supported wafer 100'' has a support structure 20', 25 that is stepped in the vertical cross-section. This may be due to manufacturing and may also facilitate spin-on processes.

Figure 5D:
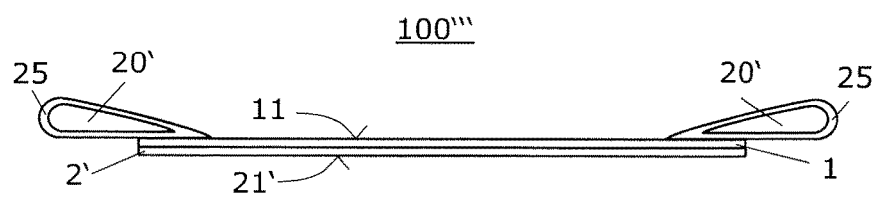
FIG. 5D illustrates a vertical cross-section through a wafer structure according to an embodiment.

FIG. 5D illustrates a vertical cross-section through a partially supported wafer 100'''. The partially supported wafer 100''' is similar to the partially supported wafer 100'' explained above with regard to FIG. 5C. However, the partially supported wafer 100''' has a wafer structure shaped to further improve drain of excess material applied by spin-on processes used during later device manufacturing.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for forming a semiconductor device, comprising:
   attaching a donor wafer comprising silicon carbide to a carrier wafer comprising graphite;
   splitting the donor wafer along an internal delamination layer so that a split layer comprising silicon carbide and attached to the carrier wafer is formed;
   forming a partially supported wafer comprising removing the carrier wafer above an inner portion of the split layer while leaving a residual portion of the carrier wafer attached to the split layer; and
   further processing the partially supported wafer.

2. The method of claim 1, wherein attaching the donor wafer comprises at least one of:
   depositing a ceramic-forming polymer precursor on a bonding surface of the donor wafer;
   depositing the ceramic-forming polymer precursor on the carrier wafer;
   forming a stack comprising the carrier wafer, the donor wafer and a bonding layer comprising the ceramic-forming polymer precursor, and arranged between the carrier wafer and the bonding surface of the donor wafer; and
   tempering the stack at a temperature between 200° C. to 700° C.

3. The method of claim 2, wherein the ceramic-forming polymer precursor comprises a polycarbosilane.

4. The method of claim 2, wherein the tempering takes place in an atmosphere comprising nitrogen, argon and/or hydrogen.

5. The method of claim 1 prior to at least partly removing the carrier wafer further comprising at least one of:
   depositing a further silicon carbide layer on the split layer:
   implanting dopants into the split layer and/or into the further silicon carbide layer; and
   thermal annealing.

6. The method of claim 1, wherein the support structure is formed as a ring covering a peripheral area of the split layer.

7. The method of claim 1, wherein removing the carrier wafer comprises at least one of:
   milling an inner portion of the carrier wafer;
   grinding an inner portion of the carrier wafer;
   masked etching of the carrier wafer;
   exposing the inner portion of the split layer;
   forming a silicon carbide layer on the residual of the carrier wafer comprising depositing silicon and a thermal process; and
   removing the deposited silicon from the split layer.

8. The method of claim 1, further comprising implanting high energy particles into the donor wafer to form the delamination layer prior to attaching the donor wafer.

9. The method of claim 1, wherein further processing further processing the partially supported wafer comprises at least one of:
   processing the split layer;
   forming a pn-junction in the split layer;
   depositing a silicon carbide layer on the split layer;
   forming a metallization on the split layer;
   forming a further pn-junction in the silicon carbide layer;
   forming a further metallization on the silicon carbide layer; and
   separating the partially supported wafer into individual semiconductor devices.

10. A method for forming a wafer structure, comprising:
    providing a silicon carbide wafer having a first side;
    implanting high energy particles from the first side into the silicon carbide wafer;
    bonding the first side of the silicon carbide wafer to a carrier wafer comprising graphite;
    splitting a first layer from the silicon carbide wafer; and
    one of:
    removing the carrier wafer above an inner portion of the first layer to form at the first layer a support structure only partly covering the first layer; and
    removing the carrier wafer after depositing a silicon carbide layer on the split layer and forming a support structure at the silicon carbide layer and only partly covering the silicon carbide layer.

11. The method of claim 10, wherein bonding the first side comprises at least one of:
    coating the first layer with a ceramic-forming polymer precursor;
    coating a bonding surfaces of the carrier wafer with the ceramic-forming polymer;
    forming a stack comprising the carrier wafer, the silicon carbide wafer and a bonding layer comprising the ceramic-forming polymer precursor, and arranged between the carrier wafer and the silicon carbide wafer; and
    tempering the stack at a temperature between 200 to 700° C.

12. The method of claim 10, wherein forming the support structure comprises at least one of:
    attaching a temporary carrier wafer to the silicon carbide layer prior to removing the carrier wafer;
    attaching a support wafer to the first layer and removing the support wafer above an inner portion of the first layer while leaving a residual portion of the support wafer attached to the split layer;
    attaching the support structure to the first layer;
    removing the temporary carrier wafer after forming the support structure at the first layer;
    removing the first layer after removing the carrier wafer;
    attaching the support structure to the silicon carbide layer;
    attaching a support wafer to the silicon carbide layer and removing the support wafer above an inner portion of the silicon carbide layer the while leaving a residual portion of the support wafer attached to the silicon carbide layer; and
    removing the temporary carrier wafer after forming the support structure at the silicon carbide layer.

13. The method of claim 12, wherein attaching the temporary carrier wafer, attaching the support wafer to the first layer, attaching the support structure to the first layer, attaching the support structure to the silicon carbide layer and/or attaching the support wafer to the silicon carbide layer comprises gluing and/or is achieved by means of a respective adhesive layer.

14. The method of claim 10, wherein removing the carrier wafer after forming the support structure at the silicon carbide layer comprises at least one of:
    polishing; and
    ashing.

15. The method of claim 10, wherein removing the carrier wafer above the inner portion comprises at least one of:
    forming a mask on the carrier wafer;
    chemical etching the carrier wafer using the mask;
    ion beam etching the carrier wafer using the mask,
    plasma etching the carrier wafer using the mask; and
    mechanically removing at least a portion of the carrier wafer.

* * * * *